United States Patent
Bruchal et al.

(10) Patent No.: US 9,810,368 B2
(45) Date of Patent: Nov. 7, 2017

(54) FLIGHT TEST INSTRUMENTATION RACK HANDLING DEVICE

(71) Applicant: THE BOEING COMPANY, Chicago, IL (US)

(72) Inventors: Liisa C. Bruchal, Seattle, WA (US); John R. Lesh, Woodinville, WA (US); Farshad Amiri, Seattle, WA (US); Charles O. Munoz, Seattle, WA (US)

(73) Assignee: THE BOEING COMPANY, Chicago, IL (US)

( * ) Notice: Subject to any disclaimer, the term of this patent is extended or adjusted under 35 U.S.C. 154(b) by 54 days.

(21) Appl. No.: 14/992,842

(22) Filed: Jan. 11, 2016

(65) Prior Publication Data

US 2017/0198858 A1 Jul. 13, 2017

(51) Int. Cl.
| | |
|---|---|
| *B62B 3/00* | (2006.01) |
| *H05K 7/18* | (2006.01) |
| *F16M 11/42* | (2006.01) |
| *B60B 19/14* | (2006.01) |
| *H05K 5/02* | (2006.01) |

(52) U.S. Cl.
CPC ............. *F16M 11/42* (2013.01); *B60B 19/14* (2013.01); *B62B 3/005* (2013.01); *H05K 5/0234* (2013.01); *H05K 7/18* (2013.01)

(58) Field of Classification Search
CPC ................................ F16M 11/42; B60B 19/14
USPC ........................................................ 280/47.34
See application file for complete search history.

(56) References Cited

U.S. PATENT DOCUMENTS

| | | | | |
|---|---|---|---|---|
| 3,891,288 A | * | 6/1975 | Marquette | B62B 3/006 211/151 |
| 4,720,048 A | * | 1/1988 | Maroney | B62B 3/00 280/47.34 |
| 6,293,568 B1 | * | 9/2001 | Butterfield | B62D 63/064 211/150 |
| 7,140,622 B1 | * | 11/2006 | Cantu | B62B 3/001 108/55.3 |
| 8,466,792 B2 | * | 6/2013 | Svalesen | G06K 17/0022 235/383 |
| 2013/0200584 A1 | * | 8/2013 | Guasta | B62B 3/005 280/79.2 |
| 2014/0027991 A1 | * | 1/2014 | Kainen | B62B 3/005 280/47.34 |
| 2014/0104759 A1 | * | 4/2014 | Takano | H05K 7/1432 361/637 |

(Continued)

OTHER PUBLICATIONS

Existing handcarts: http://www.wescomfg.com/html/hand_trucks/liftkarhd.htm; retrieved from the Internet—Jan. 11, 2016; Wesco Industrial Products, Inc., Copyright © 2016, (4 pages).

*Primary Examiner* — Xanthia C Cunningham
(74) *Attorney, Agent, or Firm* — Toler Law Group, PC

(57) ABSTRACT

A particular device includes a frame. The frame includes a first set of members defining a first side configured to be coupled to an instrumentation rack, a second set of members defining a second side, a third set of members defining a third side extending between the first side and the second side, a fourth set of members defining a fourth side, and a fifth set of members defining a fifth side. The fourth side and the fifth side are joined at an obtuse angle to extend between the first side and the second side. The device further includes a plurality of wheels coupled to the frame and extending external to the frame.

20 Claims, 7 Drawing Sheets

(56) References Cited

U.S. PATENT DOCUMENTS

| | | | | |
|---|---|---|---|---|
| 2015/0035258 A1* | 2/2015 | Chen | .......................... | B62B 3/02 |
| | | | | 280/651 |
| 2016/0052535 A1* | 2/2016 | Groat | ................... | B62B 5/0026 |
| | | | | 280/47.34 |
| 2016/0330862 A1* | 11/2016 | Pace | ...................... | F16M 13/00 |
| 2017/0007492 A1* | 1/2017 | Yamamoto | ............... | A61H 3/04 |

\* cited by examiner

FLIGHT TEST INSTRUMENTATION RACK HANDLING DEVICE

FIELD OF THE DISCLOSURE

The present disclosure relates to a flight test instrumentation rack handling device.

BACKGROUND

Flight test instrumentation racks may be used to perform in-flight testing on aircrafts. Complex in-flight testing may use a large number of instruments in order to perform the in-flight testing. As the number of instruments (e.g., components) in an instrumentation rack increases, the weight of the instrumentation rack increases, which may cause issues in transporting and installing the instrumentation rack on an aircraft. Some difficulties may arise due to the aircraft being at least partially "furnished," such that some seats (e.g., first-class seats), galleys, lavatories, and other structures are installed on the aircraft prior to installation of the instrumentation rack. Because of the location of the structures, the instrumentation rack may be difficult to maneuver into a target position on the aircraft without removal of the structures or lifting of the instrumentation rack. Removal of the structures may be prohibitively costly or difficult. Because the instrumentation rack may be wider than a width of an aisle (e.g., a distance between opposite armrests) on the aircraft, one or more technicians may lift the instrumentation rack above the armrests and carry the instrumentation rack into position. However, lifting the instrumentation rack may cause issues with the furnishings and/or technicians.

SUMMARY

In a particular implementation, a device includes a frame. The frame includes a first set of members defining a first side configured to be coupled to an instrumentation rack, a second set of members defining a second side, a third set of members defining a third side extending between the first side and the second side, a fourth set of members defining a fourth side, and a fifth set of members defining a fifth side. The fourth side and the fifth side are joined at an obtuse angle to extend between the first side and the second side. The device further includes a plurality of wheels coupled to the frame and extending external to the frame.

In another particular implementation, a method includes coupling an instrumentation rack to a frame in a first orientation. The frame includes a first set of members defining a first side configured to be coupled to the instrumentation rack, a second set of members defining a second side, a third set of members defining a third side extending between the first side and the second side, a fourth set of members defining a fourth side, and a fifth set of members defining a fifth side. The fourth side and the fifth side are joined at an obtuse angle to extend between the first side and the second side. The method further includes manipulating the frame into a second stable orientation that supports the instrumentation rack.

In another particular implementation, a system includes an instrumentation rack configured to perform one or more in-flight tests associated with an aircraft. The system further includes a transport device configured to be coupled to the instrumentation rack, the transport device comprising a frame. The frame includes a first set of members defining a first side configured to be coupled to the instrumentation rack, a second set of members defining a second side, a third set of members defining a third side extending between the first side and the second side, a fourth set of members defining a fourth side, and a fifth set of members defining a fifth side. The fourth side and the fifth side are joined at an obtuse angle to extend between the first side and the second side.

The features, functions, and advantages that have been described can be achieved independently in various embodiments or may be combined in yet other embodiments, further details of which are disclosed with reference to the following description and drawings.

DETAILED DESCRIPTION

Figure 1:
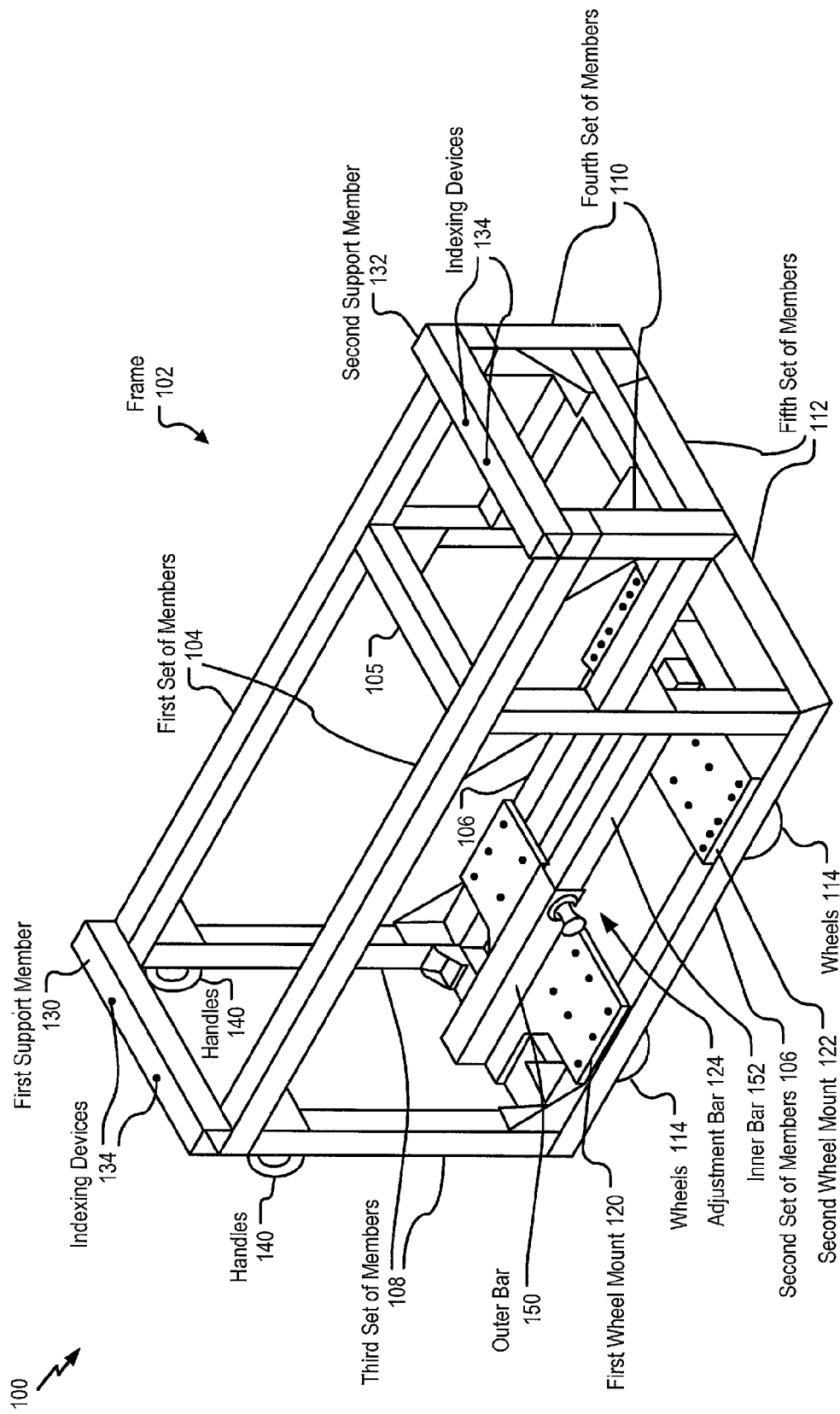
FIG. 1 is a diagram that illustrates a particular example of an instrumentation rack transportation device.

Particular implementations of the present disclosure are described below with reference to the drawings. In the description, common features are designated by common reference numbers throughout the drawings. As used herein, "exemplary" may indicate an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term).

The present disclosure describes systems, devices, and methods for providing an instrumentation rack transport device. The instrumentation rack transport device includes a frame (e.g., a plurality of members coupled together) and a plurality of interchangeable wheels. The instrumentation rack transport device may be used to transport an instrumentation rack (e.g., a flight test instrumentation rack) that is configured to perform in-flight tests during flight of an aircraft. For example, the instrumentation rack may be coupled to the instrumentation rack transport device at a first location (e.g., a hangar or other location outside of the aircraft), and the instrumentation rack may be transported to a second location (e.g., within the aircraft) using the instrumentation rack transport device.

The instrumentation rack transport device may be configured to enable transport of the instrumentation rack to a location on board an aircraft that is at least partially furnished. For example, seats (including armrests) and other furnishings may be installed on the aircraft prior to installation of the instrumentation rack. The configuration (e.g., the dimensions) of the instrumentation rack transport device may be designed to enable transport of the instrumentation rack along an aisle of the aircraft without damaging the furnishings or the instrumentation rack. Although the instrumentation rack may be wider than a width of an aisle (e.g., a distance between opposite armrests), the instrumentation rack transport device may support the instrumentation rack at an elevation that exceeds a height of the armrests. In this manner, the instrumentation rack may be transported using the instrumentation rack transport device without requiring the instrumentation rack to be lifted by one or more technicians. Eliminating the need to lift the instrumentation rack reduces issues associated with technicians having to lift the instrumentation rack.

The instrumentation rack transport device may be configured to have at least three stable orientations. When the instrumentation rack transport device is oriented in a first orientation, an "upper front" side of the instrumentation rack transport device is in contact with the ground. In the first orientation, the instrumentation rack may be coupled to the instrumentation rack transport device. After coupling the instrumentation rack to the instrumentation rack transport device, the instrumentation rack transport device may be manipulated into a second orientation, where a "lower front" side of the instrumentation rack transport device is in contact with the ground. The second orientation may provide a transitioning point between the first orientation and a third orientation, which may provide greater control over the movement of the instrumentation rack transport device and may reduce a risk of damage to the instrumentation rack as compared to manipulating the instrumentation rack transport device directly from the first orientation to the third orientation. When the instrumentation rack transport device is oriented in the third orientation, the plurality of wheels are in contact with the ground, and the instrumentation rack may be transported by rolling the instrumentation rack transport device to a target location. In the third orientation, the instrumentation rack has an elevation that exceeds the height of the armrests within the aircraft so that the instrumentation rack is able be transported along an aisle of a partially furnished or fully furnished aircraft.

Referring to FIG. 1, a diagram that illustrates a particular example of an instrumentation rack transportation device 100 is shown. The instrumentation rack transportation device 100 includes a frame 102 and a plurality of wheels 114 coupled to the frame 102 and extending external to the frame 102. The frame 102 may include a plurality of members that are coupled together, as illustrated in FIG. 1, to form the instrumentation rack transportation device 100. In a particular implementation, the plurality of members include rectangular bars formed from extruded aluminum. In other implementations, the plurality of members may include other shapes, may be formed using other materials, or both.

The frame 102 includes a first set of members 104 that defuse a first side of the frame 102 that is configured to be coupled to an instrumentation rack. The instrumentation rack is configured to perform one or more in-flight tests associated with an aircraft. For example, the instrumentation rack may include one or more components configured to measure various aspects of a flight, such as altitude, airspeed, location, time, other measurements, or a combination thereof. The instrumentation rack is further described and illustrated with reference to FIG. 3.

The first set of members 104 may include at least two members that are parallel to each other. For example, the first set of members 104 may include the two members labeled 104 in FIG. 1. In some implementations, the first set of members 104 may include two parallel members, and in other implementations the first set of members 104 may include more than two or less than two parallel members. In some implementations, the first set of members 104 may also include one or more members that are perpendicular to the parallel members. For example, the first set of members 104 may also include member 105 that is perpendicular to and between the two members labeled 104 in FIG. 1. As described above, the first set of members 104 defines the first side of the frame 102. For convenience, the first side of the frame 102 is referred to herein as the "top" side of the frame 102. Such description is not limiting, and in other orientations the first side (corresponding to the first set of members 104) may not be on the top.

The top side (e.g., the first side) is configured to be coupled to the instrumentation rack. To enable coupling to the instrumentation rack, the frame 102 includes at least one support member, such as a first support member 130 and a second support member 132, configured to be coupled to the instrumentation rack. In a particular implementation, the frame 102 includes two support members (e.g., the first support member 130 and the second support member 132), as illustrated in FIG. 1. In other implementations, the frame 102 includes more than two or fewer than two support members. The support members 130 and 132 may include one or more indexing devices 134 to facilitate alignment of the frame 102 with the instrumentation rack. The indexing devices 134 may include pins, screws, or other devices configured to be aligned with, and to couple to, the instrumentation rack. In a particular implementation, the indexing devices 134 are pins having a diameter of about one quarter (¼) of an inch.

To illustrate, the instrumentation rack may be a standardized size (e.g., instrumentation racks may include modular components within a fixed-size housing) and the instrumentation rack may have one or more indexing patterns (e.g., holes) in standardized locations. The first support member 130 and the second support member 132 may be located on the frame 102 in particular positions such that, when the frame 102 is aligned with the instrumentation rack, the indexing devices 134 (e.g., the pins) are aligned with the indexing patterns (e.g., the holes). The indexing devices 134 may be inserted into the indexing patterns to align the frame 102 with the instrumentation rack. In some implementations, the indexing devices 134 include screws, and the screws may be used to couple the frame 102 (e.g., via the first support member 130 and the second support member 132) to the instrumentation rack. In other implementations, additional means of coupling, such as ropes, cords, cables, straps, or other devices may be used to couple the instrumentation rack to the frame 102.

The frame 102 also includes a second set of members 106 that defines a second side of the frame 102. The second side may be opposite to the first side (corresponding to the first set of members 104). For example, the first side may be on the top of the frame 102, and the second side may be on the bottom of the frame 102, as illustrated in FIG. 1. For convenience, the second side of the frame 102 is referred to herein as the "bottom" side of the frame 102. Such description is not limiting, and in other orientations the second side (corresponding to the second set of members 106) may not be on the bottom.

The frame 102 includes a third set of members 108 that defines a third side of the frame 102 extending between the first side and the second side. In a particular implementation illustrated in FIG. 1, the third side is perpendicular to the first side and the second side. Additionally, as illustrated in FIG. 1, each member of the third set of members 108 may be in contact with a corresponding member of the first set of members 104 and a corresponding member of the second set of members 106. For convenience, the third side of the frame 102 is referred to herein as the "back" side of the frame 102. Such description is not limiting, and in other orientations the third side (corresponding to the third set of members 108) may not be on the back.

The frame 102 includes a fourth set of members 110 that defines a fourth side of the frame 102. The fourth side may be opposite to the third side (corresponding to the third set of members 108). For example, the third side may be on the back of the frame 102, and the fourth side may be on the front of the frame 102, as illustrated in FIG. 1. For convenience, the fourth side of the frame 102 is referred to herein as the "upper front" side of the frame 102. Such description is not limiting, and in other orientations the fourth side (corresponding to the fourth set of members 110) may not be the upper front side.

The frame 102 also includes a fifth set of members 112 that defines a fifth side of the frame 102. The fourth side (corresponding to the fourth set of members 110) and the fifth side may be joined at an obtuse angle to extend between the first side and the second side, as illustrated in FIG. 1. To further illustrate, the fifth side and the second side may be joined at an obtuse angle, and the fourth side and the first side may be joined at an approximately 90° angle (e.g., a right angle). For convenience, the fifth side of the frame 102 is referred to herein as the "lower front" side of the frame 102. Such description is not limiting, and in other orientations the fifth side (corresponding to the fifth set of members 112) may not be the lower front side.

Each of the first set of members 104, the second set of members 106, the third set of members 108, the fourth set of members 110, and the fifth set of members 112 may include at least two members that are oriented parallel (or approximately parallel) to each other, as illustrated in FIG. 1. In other implementations, one or more of the first set of members 104, the second set of members 106, the third set of members 108, the fourth set of members 110, the fifth set of members 112 may include more than two or fewer than two members. In some implementations, one or more of the first set of members 104, the second set of members 106, the third set of members 108, the fourth set of members 110, and the fifth set of members 112 may include one or more members that are not parallel (or approximately parallel) to the corresponding at least two members, such as one or more perpendicular or diagonal members that extend between the at least two members and that are configured to provide structural support for the frame 102.

The instrumentation rack transport device 100 may include one or more wheel mounts that are coupled to the plurality of wheels 114 and to the frame 102 (e.g., to the second set of members 106). For example, the instrumentation rack transport device 100 may include a first wheel mount 120 and a second wheel mount 122. In a particular implementation, the wheel mounts 120 and 122 are plates (e.g., metal plates) that are configured to be coupled to the plurality of wheels 114. In a particular implementation, the plurality of wheels 114 may be interchangeable wheels. For example, the plurality of wheels 114 may be removed from the first wheel mount 120 and the second wheel mount 122 and may be replaced with different types of wheels. In this manner, different wheels may be used based on various situations. To illustrate, "outdoor" wheels (e.g., wheels with treads) may be used outdoors, "indoor" wheels (e.g., wheels having a smooth surface) may be used indoors, larger wheels may be used to further elevate the instrumentation rack, and omnidirectional wheels may be used for maneuvering in small spaces. Alternatively, the plurality of wheels 114 may be permanently coupled to the first wheel mount 120 and the second wheel mount 122. In an alternate implementation, the first wheel mount 120 and the second wheel mount 122 are not included, and the plurality of wheels 114 are coupled directly to the frame 102, as further described with reference to FIG. 6. When coupled to the first wheel mount 120 and the second wheel mount 122, the plurality of wheels extend external to the frame 102, as further illustrated with reference to FIG. 2.

The plurality of wheels 114 may include multiple types of wheels. For example, the plurality of wheels 114 may include a plurality of rotary caster wheels. As another example, the plurality of wheels 114 may include a plurality of swivel-plate caster wheels. As yet another example, the plurality of wheels 114 may include a plurality of omnidirectional wheels, as further described with reference to FIG. 6. Omnidirectional wheels may be configured to move in multiple directions other than forwards and backwards. As another example, the plurality of wheels 114 may include a plurality of outdoor wheels, a plurality of indoor wheels, a plurality of larger wheels, a plurality of smaller wheels, or other types of wheels. The plurality of wheels 114 may be formed from materials such as rubber, plastic, metal, or other materials. In some implementation, brakes may be coupled to the plurality of wheels 114 (e.g., the plurality of wheels 114 may be braked or locked to prevent rolling when the instrumentation rack transport device 100 is not being moved).

In a particular implementation, at least one of the first wheel mount 120 and the second wheel mount 122 is an adjustable wheel mount. In some implementations, both the first wheel mount 120 and the second wheel mount 122 are adjustable wheel mounts. The instrumentation rack transport device 100 may include an adjustment bar 124 that is configured to enable adjustment of one or more of the first wheel mount 120 and the second wheel mount 122. The adjustment bar 124 may be coupled to the first wheel mount 120 and to the second wheel mount 122. Due to the adjustment bar 124, at least one wheel mount may be lockable in multiple positions. To illustrate, the first wheel mount 120 may be fixed in the position illustrated in FIG. 1, and the position of the second wheel mount 122 may be adjusted using the adjustment bar 124. The adjustment bar 124 may include an outer bar 150 (e.g., the left-most portion of the adjustment bar 124 in FIG. 1) and an inner bar 152 (e.g., the right-most portion of the adjustment bar 124 in FIG. 1).

A distance that the inner bar 152 extends outwards from the outer bar 150 may be adjustable. For example, the inner bar 152 may be locked into multiple positions (e.g., multiple different extension distances). Because the second wheel mount 122 is coupled to the inner bar 152, the second wheel mount 122 (as compared to the position of the first wheel mount 120) is based on the position of the inner bar 152. In a particular implementation, the inner bar 152 may have a plurality of holes, and a knob (illustrated in FIG. 1) may be adjusted to fit into one of the plurality of holes, thereby locking the second wheel mount 122 (and the inner bar 152) into one of multiple positions. In another particular implementation, the knob may be rotated in a first direction to enable extension of the inner bar 152 to a selected position, and the knob may be rotated in an opposite direction to tighten and lock the inner bar 152, and the second wheel mount 122, into position. The above description is not limiting, and in other implementations other components or devices may be used to perform the functions of the adjustment bar 124. In some implementations, both the first wheel mount 120 and the second wheel mount 122 may be adjustable. For example, the first wheel mount 120 may be lockable in one of a first set of positions, the second wheel mount 122 may be lockable in one of a second set of positions, and the adjustment bar 124 may be used to set a distance between the first wheel mount 120 and the second wheel mount 122, and to lock the first wheel mount 120 and the second wheel mount 122 into position.

The instrumentation rack transport device 100 may also include a plurality of handles 140 coupled to the third set of members 108. The plurality of handles 140 may be coupled to the back side of the frame 102 (e.g., to the third set of members 108) when the frame 102 is in the orientation illustrated in FIG. 1. The plurality of handles 140 may be used by a technician (e.g., an operator) to guide or direct the instrumentation rack transport device 100 during movement. Additionally, the plurality of handles 140 may be used by the technician to manipulate the frame 102 between multiple stable orientations, as further described with reference to FIG. 3.

The instrumentation rack transport device 100 (e.g., the frame 102) may be manipulated into one of multiple stable orientations during use by the technician. In a first orientation, the upper front side (e.g., the fourth side defined by the fourth set of members 110) is in contact with the ground. The frame 102 is configured to be coupled to the instrumentation rack in the first orientation, as further described with reference to FIG. 3. The frame 102 may be easier to couple to the instrumentation rack when the frame 102 is in the first orientation, as compared to the other orientations. For example, the instrumentation rack may be positioned in a standing orientation (e.g., an upright orientation), and the instrumentation rack transport device 100 may be moved alongside the instrumentation rack such that the indexing devices 134 align with the one or more indexing patterns of the instrumentation rack. The frame 102 may be coupled to the instrumentation rack using the indexing devices 134 (and one or more other coupling devices) without having to support the weight of the instrumentation rack.

After instrumentation rack is coupled to the frame 102, the frame 102 may be manipulated into a second orientation. In the second orientation, the lower front side (e.g., the fifth side defined by the fifth set of members 112) is in contact with the ground. The frame 102 may be configured to support the instrumentation rack on the lower front side (e.g., a center of gravity of the instrumentation rack may be over the lower front side) when the frame 102 is configured in the second orientation. The second orientation may provide a transitioning point between the first orientation and a third orientation, which may reduce a risk of damage to the instrumentation rack as compared to manipulating the frame 102 directly from the first orientation to the third orientation. Additionally, the technician may be able to cause the instrumentation rack transport device 100 to make tighter turns when the frame 102 is in the second orientation. To illustrate, the surface area on the bottom when the frame 102 is in the second orientation (e.g., the surface area of the lower front side) may be less than the surface area on the bottom when the frame 102 is in the third orientation (e.g., the surface area of the bottom side), which may enable the instrumentation rack transport device 100 to have a tighter turning radius. For example, the technician may place a sheet of plastic or other covering on the floor of an aircraft where the entrance ramp and the aisle make a corner, and the instrumentation rack transport device 100 may be manipulated into the second orientation and turned to make a tighter (e.g., sharper) turn than would be possible if the instrumentation rack transport device 100 were in the third orientation (e.g., the orientation pictured in FIG. 1).

After transitioning from the first orientation to the second orientation, the frame 102 may be manipulated into the third orientation. In the third orientation, the plurality of wheels 114 are in contact with the ground. The frame 102 is configured to support the instrumentation rack on the plurality of wheels 114 when the frame 102 is oriented in the third orientation. In the third orientation, the instrumentation rack may be transported by the technician rolling the instrumentation rack transport device 100 to a target location on the aircraft. When the frame 102 is oriented in the third orientation, an elevation of the instrumentation rack exceeds an elevation of armrests on the aircraft, as further described with reference to FIG. 5. Additionally, a width of the frame 102 is less than a distance between opposing aircraft seat armrests along an aisle of the aircraft. Because of the elevation of the instrumentation rack and the width of the frame 102, the instrumentation rack transport device 100 may be moved along an aisle without possibly causing damage to the instrumentation rack or to the furnishings of the aircraft, and without having the technician lift the instrumentation rack. Thus, the instrumentation rack may be maneuvered to the target location more easily using the instrumentation rack transport device 100 than using other means of transport. Once the instrumentation rack transport device 100 reaches the target location, the frame 102 may be manipulated into the second orientation, and then into the first orientation to enable the instrumentation rack to be decoupled from the instrumentation rack transport device and coupled to the target location of the aircraft.

Thus, the instrumentation rack transport device 100 enables safe and efficient transport of instrumentation racks to target locations on furnished, or partially furnished aircrafts. For example, due to the width of the frame 102 and the elevation of the instrumentation rack when the frame 102 is oriented in the third orientation, an instrumentation rack may be moved along an aisle of an aircraft that has seats (and armrests) already installed. Because installation of first-class seats may occur early in the furnishing of an aircraft, due to the electronics included in the first-class seats, aircrafts may have first-class seats installed prior to flight tests. Because instrumentation racks may be transported without damaging the first-class seats, use of the instrumentation rack transport device 100 may eliminate the need for costly first-class seat removal. Additionally, use of the instrumentation rack transport device 100 may reduce or eliminate the need for technicians to lift the instrumentation rack during transport, which reduces a risk of damage to the instrumentation rack and to the furnishings of the aircraft. Also, because the frame 102 is configured to be oriented in at least three stable orientations, risk of damage to the instrumentation rack when changing orientations of the frame 102 may be reduced, as compared to if the second orientation was not usable (e.g., if the frame 102 was manipulated directly from the first orientation to the third orientation). For example, because the frame 102 may be paused in the second orientation, a risk that the weight of the instrumentation rack may cause the frame 102 to change orientations too quickly, and thereby damage the instrumentation rack, is reduced.

Figure 2:
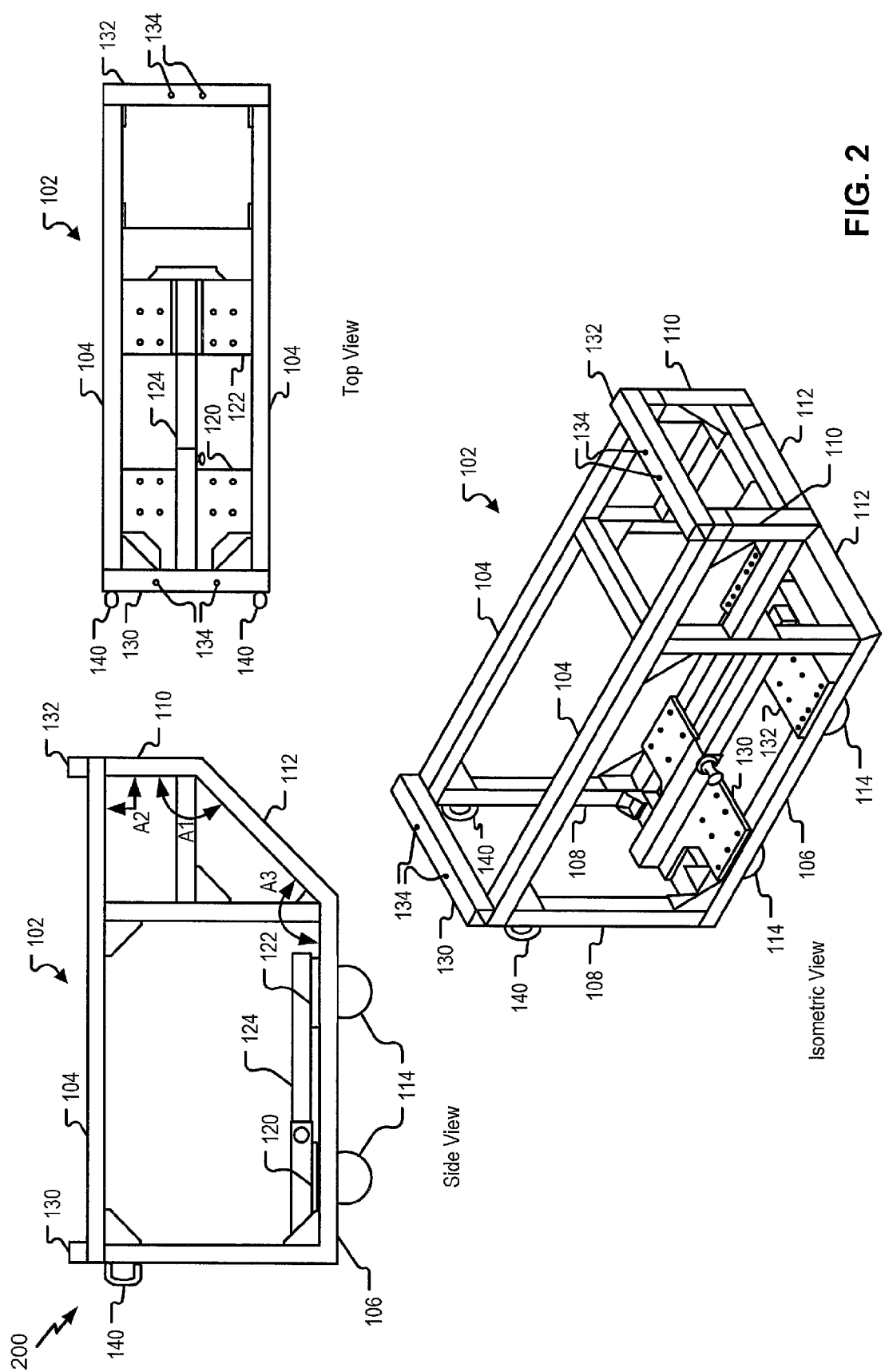
FIG. 2 is a diagram that illustrates three views of the instrumentation rack transport device of FIG. 1.

Referring to FIG. 2 a diagram 200 that illustrates three views of the instrumentation rack transport device 100 of FIG. 1 is shown. A side view, a top view, and an isometric view of the instrumentation rack transport device 100 are illustrated in FIG. 2. The isometric view represents a smaller version of the view depicted in FIG. 1.

At least one member of each of the first set of members 104, the second set of members 106, the third set of members 108, the fourth set of members 110, and the fifth set of members 112 is illustrated in the side view. Other members of the sets of members 104-112 may be obscured (e.g., may be behind the illustrated members) in the side view. As described above, the first set of members 104 defines the top side (e.g., the first side), the second set of members 106 defines the bottom side (e.g., the second side), the third set of members 108 defines the back side (e.g., the third side), the fourth set of members 110 defines the upper front side (e.g., the fourth side), and the fifth set of members 112 defines the lower front side (e.g., the fifth side). The plurality of wheels 114 is coupled to the frame (e.g., to the second set of members 106) and extends external to the frame 102. For example, as illustrated in the side view of FIG. 2, at least a portion of the plurality of wheels 114 extend below the second set of members 106 (e.g., external to the frame 102). As described above, the plurality of wheels 114 may be interchangeable and may be coupled to the first wheel mount 120 and the second wheel mount 122.

As illustrated in the side view depicted in FIG. 2, the upper front side (e.g., the fourth side defined by the fourth set of members 110) and the lower front side (e.g., the fifth side defined by the fifth set of members 112) are joined at obtuse angle A1. The upper front side and the lower front side extend between the top side (e.g., the first side defined by the first set of members 104) and the bottom side (e.g., the second side defined by the second set of members 106). To illustrate, the upper front side and the lower front side extend between a virtual plane that extends along (e.g., parallel to) the top side and a virtual plane that extends along the bottom side. The upper front side is also joined with the top side at right angle A2, which is approximately 90°. The lower front side is also joined with the bottom side at obtuse angle A3. The back side is joined to the top side and to the bottom side at approximately right angles. The values of obtuse angles A1 and A3 may be selected during a design process based on a target length of the fourth set of members 110 and the fifth set of members 112. To illustrate, if the obtuse angle A3 is smaller and the length of the fifth set of members 112 are larger, the frame 102 may have a more stable base (e.g., the lower front side) when the frame 102 is oriented in the second orientation. Alternatively, if the obtuse angle A1 is smaller and the length of the fourth set of members 110 is larger, the frame 102 may have a more stable base (e.g., the upper front side) when the frame 102 is oriented in the first orientation.

The top view illustrates the first set of members 104, the first wheel mount 120, the second wheel mount 122, the adjustment bar 124, the plurality of handles 140, the first support member 130, and the second support member 132. Although only two support members 130 and 132 are illustrated, in other implementations, the instrumentation rack transport device 100 may include more than two or fewer than two support members. As described above, each of the support members 130 and 132 may include the indexing devices 134 that are configured to be aligned with (and coupled to) the instrumentation rack. Although two indexing devices 134 are illustrated for each of the support members 130 and 132, in other implementations, more than two or fewer than two indexing devices may be coupled to each support member.

Figure 3:
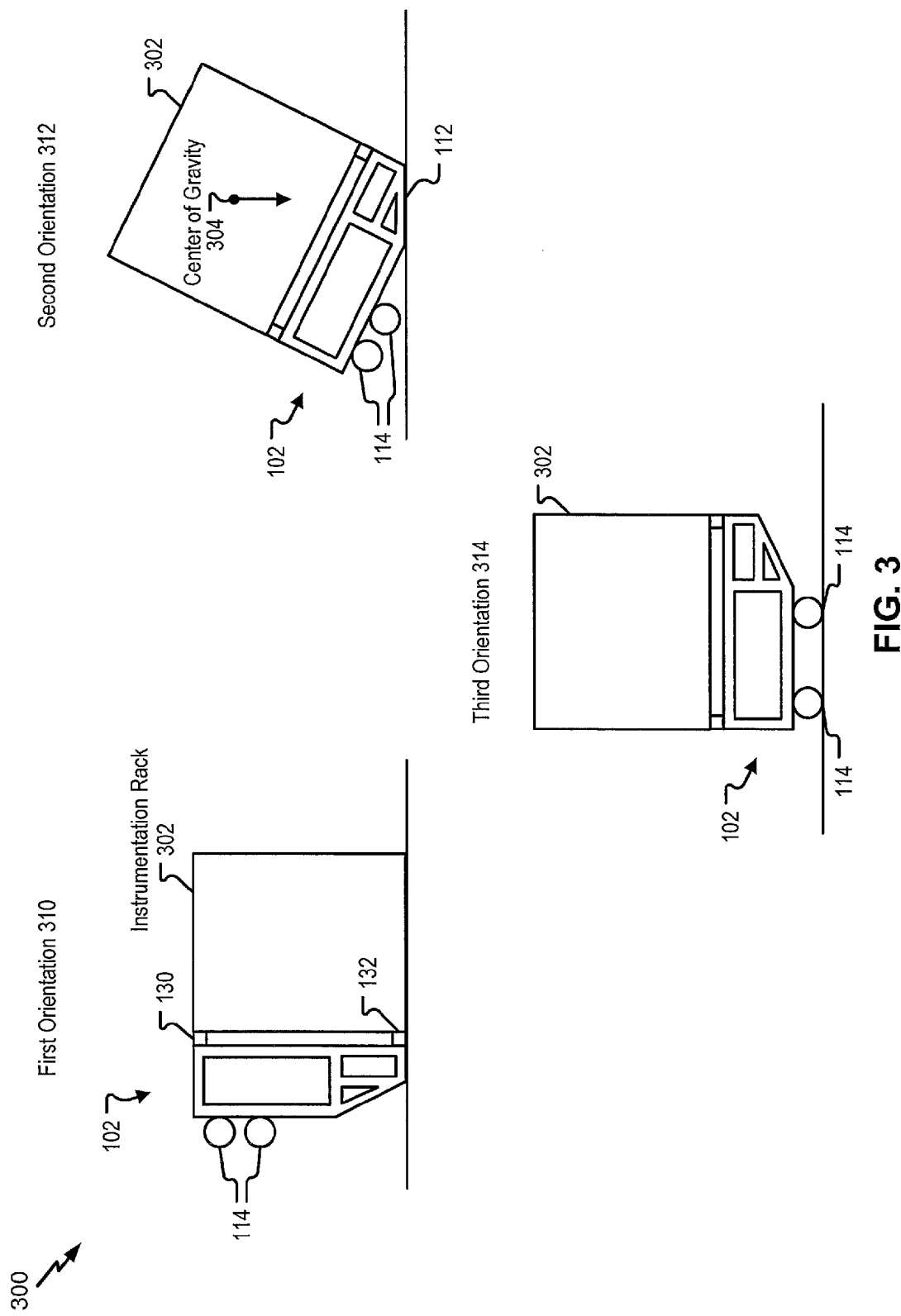
FIG. 3 is a diagram that illustrates an example of a system including an instrumentation rack and the instrumentation rack transport device of FIG. 1.

Referring to FIG. 3, a diagram that illustrates an example of a system 300 including an instrumentation rack 302 and the instrumentation rack transport device 100 of FIG. 1 is shown. The instrumentation rack 302 may be configured to perform in-flight tests during flight of an aircraft. For example, the instrumentation rack 302 may include one or more components configured to measure various aspects of a flight, such as altitude, airspeed, aerodynamics, location, time, performance measurements, fuel measurements, other measurements, or a combination thereof. In a particular implementation, the instrumentation rack 302 is modular (e.g., one or more components may be added or removed based on the in-flight testing to be performed by the instrumentation rack 302). Although the instrumentation rack 302 is modular, the instrumentation rack 302 may have a standardized size (e.g., a frame size) that is independent of the number of components that are included.

Based on the amount of in-flight testing to be performed, an aircraft may be equipped with fewer instrumentation racks (e.g., approximately one to three) or more instrumentation racks (e.g., thirty or more), with one or more technicians to operate the instrumentation racks during the flight. Each instrumentation rack 302 may weigh between approximately 65 pounds (when the instrumentation rack 302 is empty) and approximately 400 pounds (when the instrumentation rack 302 is fully loaded). Moving multiple heavy instrumentation racks onto an aircraft is a time and labor-intensive activity. Additionally, if the instrumentation rack 302 is lifted by technicians during transport, the weight of the instrumentation rack 302 may cause a significant risk that the instrumentation rack 302 will be dropped, causing damage to the instrumentation rack 302 or damage to the furnishings of the aircraft. Use of the instrumentation rack transport device 100 to transport the instrumentation rack 302 may provide a safe and efficient means for moving the instrumentation rack 302 that provides a significant reduction to the risk of damage to the instrumentation rack 302 (or to the furnishings of the aircraft). For example, the instrumentation rack 302 may be transported to a target location on a furnished, or partially furnished, aircraft without being lifted by technicians by using the instrumentation rack transport device 100.

FIG. 3 illustrates the frame 102 and the instrumentation rack 302 in a first orientation 310, a second orientation 312, and a third orientation 314. The frame 102 is configured to be coupled to the instrumentation rack 302 in the first orientation 310, and the frame 102 is further configured to support the instrumentation rack 302 in the second orientation 312 and the third orientation 314 (e.g., in at least two stable orientations).

In the first orientation 310, the upper front side (e.g., the fourth side defined by the fourth set of members 110) is in contact with the ground. The frame 102 is configured to be coupled to the instrumentation rack 302 in the first orientation 310. To illustrate, the instrumentation rack 302 may be loaded with the one or more modular components at a first location (e.g., in a hanger, in an equipment room, etc.). The instrumentation rack 302 may be positioned in a standing orientation (e.g., an orientation that the instrumentation rack 302 will be oriented in when aboard the aircraft), and the instrumentation rack transport device 100 may be moved alongside the instrumentation rack 302 such that the indexing devices 134 align with one or more indexing patterns of the instrumentation rack 302. For example, the indexing devices 134 may be pins (or screws), and the pins may be aligned with the one or more indexing patterns (e.g., one or more holes) of the instrumentation rack 302. The frame 102 may be coupled to the instrumentation rack using the indexing devices 134, one or more other coupling devices, or a combination thereof, without having to support the weight of the instrumentation rack 302 in the first orientation 310.

After instrumentation rack 302 is coupled to the frame 102, the frame 102 may be manipulated into the second orientation 312. In the second orientation 312, the lower front side (e.g., the fifth side defined by the fifth set of members 112) is in contact with the ground. The frame 102 may be configured to support the instrumentation rack 302 on the lower front side when the frame 102 is configured in the second orientation 312. For example, the frame 102 may be configured such that a center of gravity 304 of the instrumentation rack 302 is above the lower front side (e.g., the fifth side) when the frame 102 is oriented in the second orientation 312. The second orientation 312 may provide a transitioning point between the first orientation 310 and the third orientation 314. For example, instead of being transitioned directly from the first orientation 310 to the third orientation 314, the frame 102 may be transitioned first from the first orientation 310 to the second orientation 312, and then from the second orientation 312 to the third orientation 314. Transitioning the frame 102 from the first orientation 310 to the second orientation 312 may be easier (e.g., may require less force) for a technician than transitioning the frame 102 from the first orientation 310 directly to the third orientation 314. Additionally, having a stable orientation between the first orientation 310 and the third orientation 314 enables the transition from the first orientation 310 to the third orientation 314 to occur in two smaller steps (e.g., as compared to one big step), which may be easier for a technician to perform and may reduce a risk of damage to the instrumentation rack 302.

When the frame 102 is oriented in the second orientation 312, the frame 102 may be manipulated into the third orientation 314. In the third orientation 314, the plurality of wheels 114 are in contact with the ground. The frame 102 is configured to support the instrumentation rack 302 on the plurality of wheels 114 when the frame 102 is oriented in the third orientation 314. In the third orientation 314, the instrumentation rack 302 may be transported by the technician rolling the instrumentation rack transport device 100 to a target location on the aircraft. When the frame 102 is oriented in the third orientation 314, an elevation of the instrumentation rack 302 exceeds an elevation of armrests on the aircraft, as further described with reference to FIG. 5. Because of the elevation of the instrumentation rack 302, the instrumentation rack transport device 100 may be moved along an aisle without causing damage to the instrumentation rack 302 or to the furnishings of the aircraft, and without requiring the technician to lift the instrumentation rack 302. Once the instrumentation rack transport device 100 reaches the target location, the frame 102 may be manipulated into the second orientation 312, and then into the first orientation 310 to enable the instrumentation rack 302 to be decoupled from the instrumentation rack transport device 100 and to be coupled to the target location of the aircraft. Because the instrumentation rack 302 is returned to the standing orientation (e.g., in the first orientation 310), the instrumentation rack 302 may be more easily aligned to and coupled to the target location on the aircraft.

Thus, FIG. 3 illustrates three stable orientations of the system 300. As described above, providing the second orientation 312 may make transitioning the system 300 from the first orientation 310 to the third orientation 314 (or from the third orientation 314 to the first orientation 310) easier for a technician, as well as reducing a risk of damage to the instrumentation rack 302. Additionally, the technician may be able to cause the instrumentation rack transport device 100 to make tighter turns when the system 300 is oriented in the second orientation 312. To illustrate, the surface area on the bottom when the frame 102 is in the second orientation 312 (e.g., the surface area of the lower front side) may be less than the surface area on the bottom when the frame 102 is in the third orientation 314 (e.g., the surface area of the bottom side), which may enable the instrumentation rack transport device 100 to have a tighter turning radius. Once a turn is complete, the instrumentation rack transport device 100 may be returned to a previous orientation (e.g., the third orientation 314) to continue transporting the instrumentation rack 302 to a target location.

Figure 4:
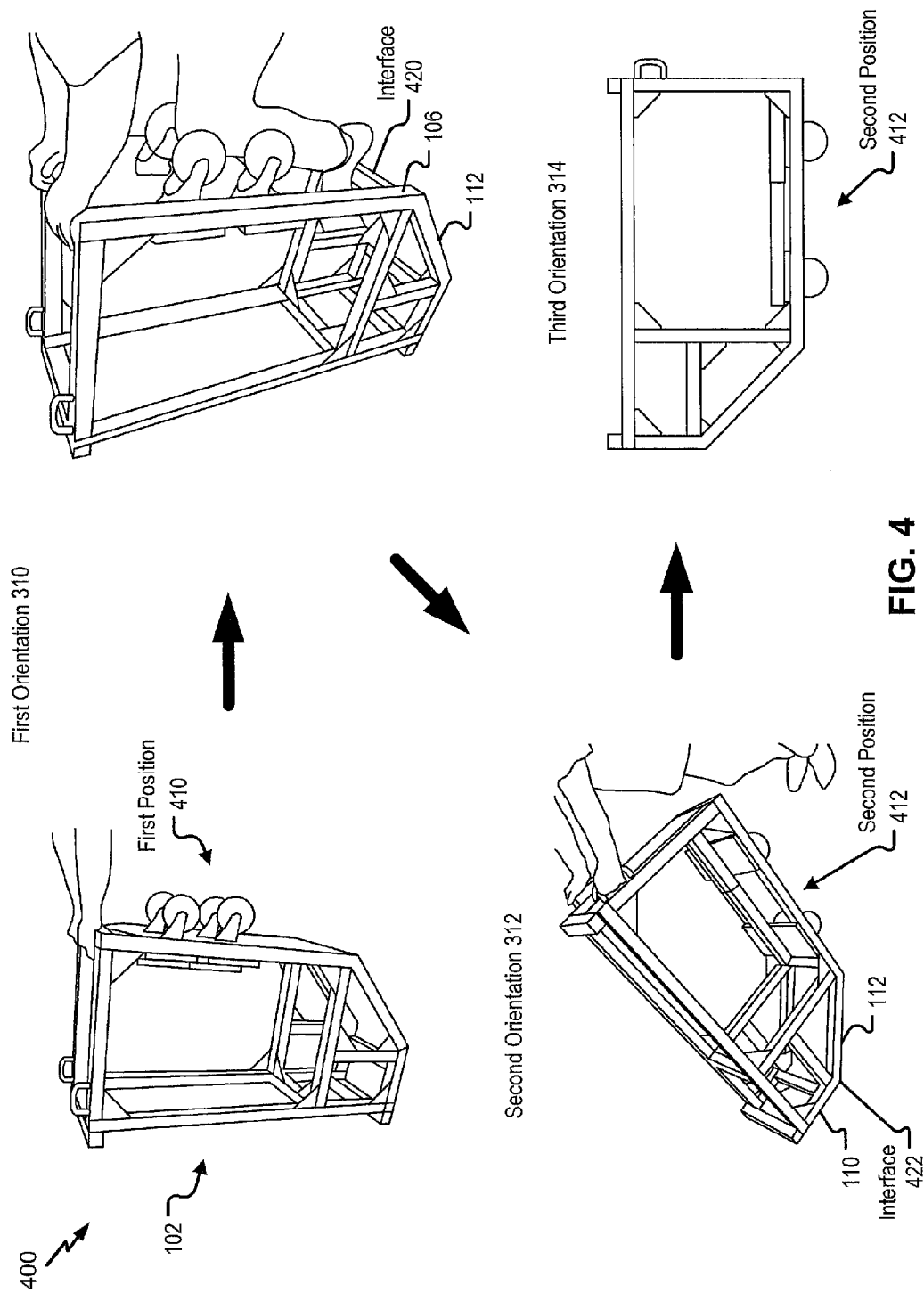
FIG. 4 is a diagram that illustrates three orientations of the instrumentation rack transport device of FIG. 1.

Referring to FIG. 4, a diagram 400 that illustrates three orientations of the instrumentation rack transport device 100 of FIG. 1 is shown. FIG. 4 illustrates actions by a technician to manipulate the instrumentation rack transport device 100 into the various orientations. FIG. 4 illustrates three orientations: the first orientation 310, the second orientation 312, and the third orientation 314.

As described with reference to FIG. 3, the upper front side (e.g., the fourth side defined by the fourth set of members 110) is in contact with the ground when the frame 102 is oriented in the first orientation 310. The frame 102 may be coupled to the instrumentation rack 302 when the frame 102 is oriented in the first orientation 310.

At least one of the wheel mounts 120 and 122 may be lockable in multiple positions. As an example, the plurality of wheels 114 and the wheel mounts 120 and 122 may be locked in the first position 410. To illustrate, the second wheel mount 122 may be locked in the first position 410 that is adjacent to the first wheel mount 120. The first wheel mount 120 and the second wheel mount 122 may be locked in the first position 410 using the adjustment bar 124, as described with reference to FIG. 1. Locking the wheel mounts 120 and 122 in the first position 410 may keep the plurality of wheels 114 out of an area to which the technician will apply force to manipulate the frame 102 into the second orientation 312. The second wheel mount 122 may also be locked in a second position, as further described herein.

As illustrated in the image in the upper right of FIG. 4, the frame 102 may include a first interface 420 between the second set of members 106 and the fifth set of members 112. The first interface 420 includes at least one member that is configured to receive force applied by a user (e.g., the technician) when the frame 102 is manipulated from the first orientation 310 into the second orientation 312. For example, the first interface 420 may include a member that perpendicularly intersects the second set of members 106, the fifth set of members 112, or both, and the technician may apply force to the first interface 420 by stepping on the first interface 420 and pressing "down" with their foot. Pressing down with the technician's foot may apply sufficient force to the first interface 420 to cause the frame 102 to rock in the direction of the technician. Rocking the frame 102 toward the technician may begin manipulating the frame 102 from the first orientation 310 to the second orientation 312.

The frame 102 also includes a second interface 422 between the fourth set of members 110 and the fifth set of members 112. For example, the second interface 422 may include at least one member that perpendicularly intersects the fourth set of members 110, the fifth set of members 112, or both. The second interface 422 may be configured to operate as a fulcrum when the frame 102 is manipulated from the first orientation 310 into the second orientation 312.

For example, after force is applied to the first interface 420, the frame 102 may be rocked back on the second interface 422 (e.g., the second interface 422 may be used as a fulcrum) as the frame 102 is manipulated from the first orientation 310 into the second orientation 312. The frame 102 may come to rest in the second orientation 312 so that the technician can control the rate of descent of the back side (e.g., the side defined by the third set of members 108) more easily than if the frame 102 was manipulated all the way into the third orientation 314.

When the frame is oriented in the second orientation 312, the wheel mounts 120 and 122 (and the plurality of wheels 114) may be moved and locked into a second position 412. For example, the second wheel mount 122 may be moved toward the front of the frame 102 and locked into the second position 412 using the adjustment bar 124. The second position 412 may separate the first wheel mount 120 (and at least two wheels of the plurality of wheels 114) from the second wheel mount 122 (and at least two other wheels of the plurality of wheels 114), which may better enable the plurality of wheels to support the weight of the instrumentation rack 302 and provide for better rolling when the frame 102 is in the third orientation 314.

After setting the wheel mounts 120 and 122 in the second position 412, the technician may manipulate the frame 102 from the second orientation 312 into the third orientation 314. For example, the technician may lower the back side (e.g., the third side defined by the third set of members 108) until the bottom side (e.g., the second side defined by the second set of members 106) is horizontal (e.g., parallel with the ground). Once the frame 102 is in the third orientation 314, the instrumentation rack 302 is supported by the plurality of wheels 114. The technician may use the plurality of handles 140 to guide the frame 102 and to control a rate of decent of the frame 102 as the frame 102 is manipulated into the third orientation 314. After the frame 102 is in the third orientation 314, the technician may use the plurality of handles 140 to guide the instrumentation rack transport device 100 as the instrumentation rack transport device 100 is rolled to the target location on the aircraft.

Figure 5:
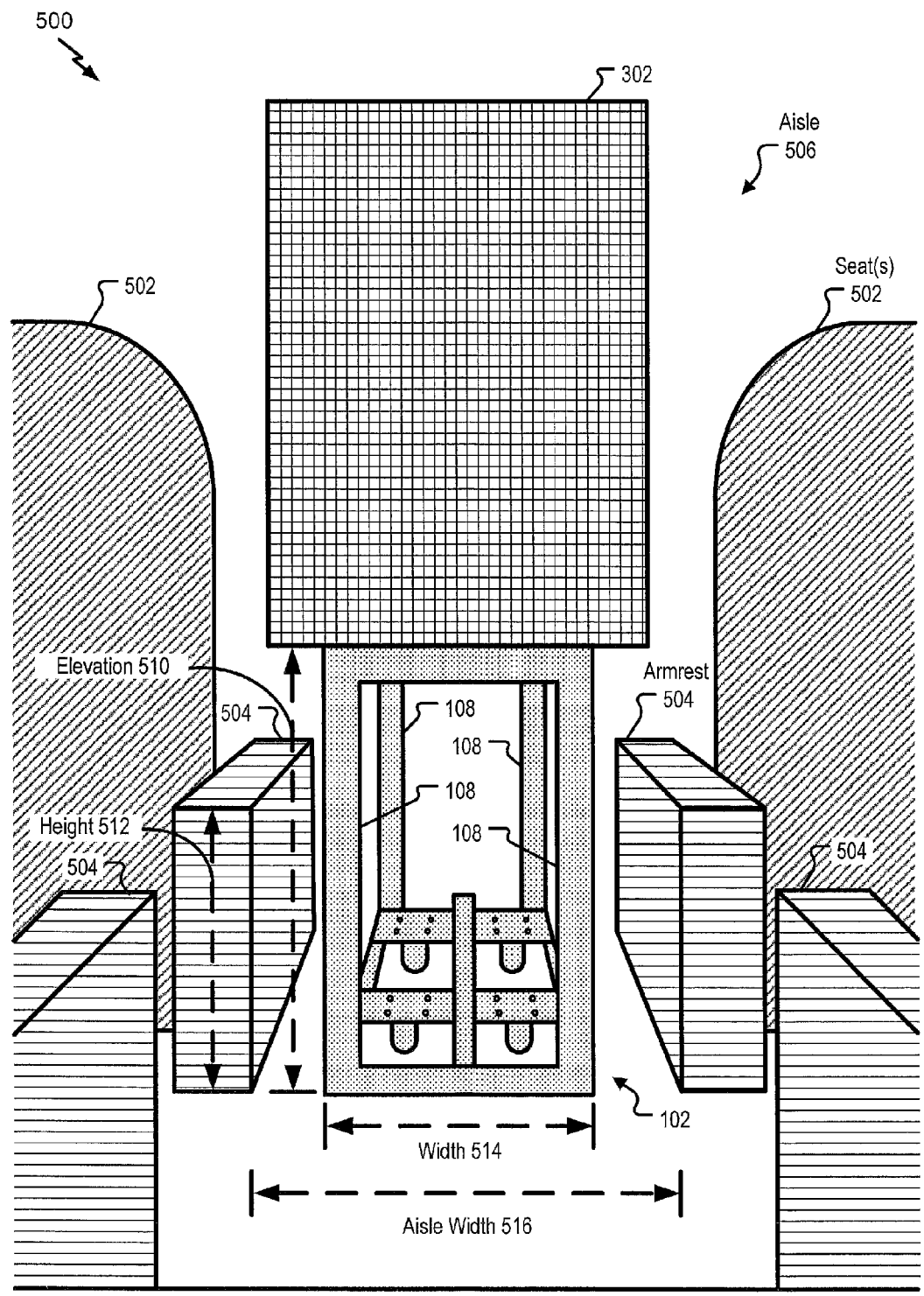
FIG. 5 is a diagram that illustrates an example of the instrumentation rack transport device of FIG. 1 on an aircraft.

Referring to FIG. 5, a diagram 500 that illustrates an example of the instrumentation rack transport device 100 of FIG. 1 on an aircraft is shown. The frame 102 and the instrumentation rack 302 are oriented in the third orientation 314 of FIGS. 3-4.

The aircraft may be a partially or fully furnished aircraft. For example, the aircraft may have a plurality of seats 502 having a plurality of armrests 504 prior to loading the instrumentation rack 302 on to the aircraft. Additionally, lavatories, galleys, luggage compartments, and other fixtures may be installed on the aircraft. The plurality of seats 502 may be arranged into multiple rows, and the plurality of seats 502 may be located to define an aisle 506 between at least two seats of each row. The aisle may be configured to be wide enough to allow people, luggage, flight equipment, or a combination thereof, to move throughout the aircraft unimpeded by the plurality of seats 502. The plurality of seats 502 may include first or business class seats. First class seats may be installed early on in a furnishing process of the aircraft, and may be difficult to remove after installation, because entertainment units or other electronics coupled to the first class seats may be wired to a power system of the aircraft. Thus, the plurality of seats 502 may be installed on the aircraft prior to installation of the instrumentation rack 302, and the plurality of seats 502 and the plurality of armrests 504 may be obstacles to transportation of the instrumentation rack 302.

To illustrate, a width of the instrumentation rack 302 may be wider than an aisle width 516 (e.g., a distance between two armrests 504 on opposite sides of the aisle 506). For example, a width of the instrumentation rack 302 may be approximately 21 inches, and the aisle width 516 may be approximately 17 inches. If the instrumentation rack 302 is loaded on the aircraft without using the instrumentation rack transport device 100, the instrumentation rack 302 may be lifted by one or more technicians to move the instrumentation rack 302 along the aisle 506. As described above, the instrumentation rack 302 may weigh between approximately 60 pounds and 400 pounds. Due to this weight, lifting the instrumentation rack 302 may pose significant risk that the instrumentation rack 302 may be dropped and cause damage to the instrumentation rack 302 or to the aircraft (e.g., to the plurality of armrests 504 or to other furnishings). To reduce or eliminate the risk of damage, the instrumentation rack 302 may be moved using the instrumentation rack transport device 100.

The instrumentation rack transportation device 100 may be configured such that, when the frame 102 and the instrumentation rack 302 are oriented in the third orientation 314, the dimensions of the instrumentation rack transport device 100 fit within the confines of the aisle 506. To illustrate, a width 514 of the frame 102 is less than the aisle width 516 (e.g., the distance between opposite armrests 504 along the aisle 506). For example, the width 514 of the frame 102 may be approximately 16 inches, which is less than the aisle width 516 of approximately 17 inches. Thus, the instrumentation rack transport device 100 may fit between the opposite armrests 504 along the aisle 506.

As described above, the instrumentation rack 302 may be wider than the aisle width 516. To enable the instrumentation rack 302 to be moved along the aisle, the frame 102 may support the instrumentation rack 302 at a position that is higher than the plurality of armrests 504. To illustrate, a length of at least one member of the third set of members 108 is configured such that, when the frame 102 is oriented in the third orientation 314, an elevation 510 of the top side (e.g., the first side defined by the first set of members 104) exceeds a height 512 of the armrests 504 of the plurality of seats 502. For example, the elevation 510 may be approximately 26 inches, which exceeds the height 512, which may be approximately 25 inches. Because the elevation 510 exceeds the height 512, the instrumentation rack 302 may be elevated above the plurality of armrests 504. The distance between two opposite seats along the aisle 506 may be greater than the width of the instrumentation rack 302. For example, the distance between two opposite seats may be approximately 24 inches, which exceeds the width of the instrumentation rack 302, which may be approximately 21 inches. Thus, by elevating the instrumentation rack 302 at the elevation 510 that exceeds the height 512 of the plurality of armrests 504, the instrumentation rack transport device 100 enables the instrumentation rack 302 to be transported along the aisle 506. Transporting the instrumentation rack 302 using the instrumentation rack transport device 100 eliminates the need for technicians to lift the instrumentation rack 302, which reduces a risk of damage to the instrumentation rack 302 and to the furnishings of the aircraft.

Although particular measurements have been described with reference to FIG. 5, the measurements are not limiting. In other implementations, the dimensions described with reference to FIG. 5 may have different values as long as the relationships between the dimensions remain the same (e.g., as long as the aisle width 516 exceeds the width 514 of the instrumentation rack 302, the elevation 510 exceeds the height 512, and the distance between opposite seats exceeds the width of the instrumentation rack 302).

Figure 6:
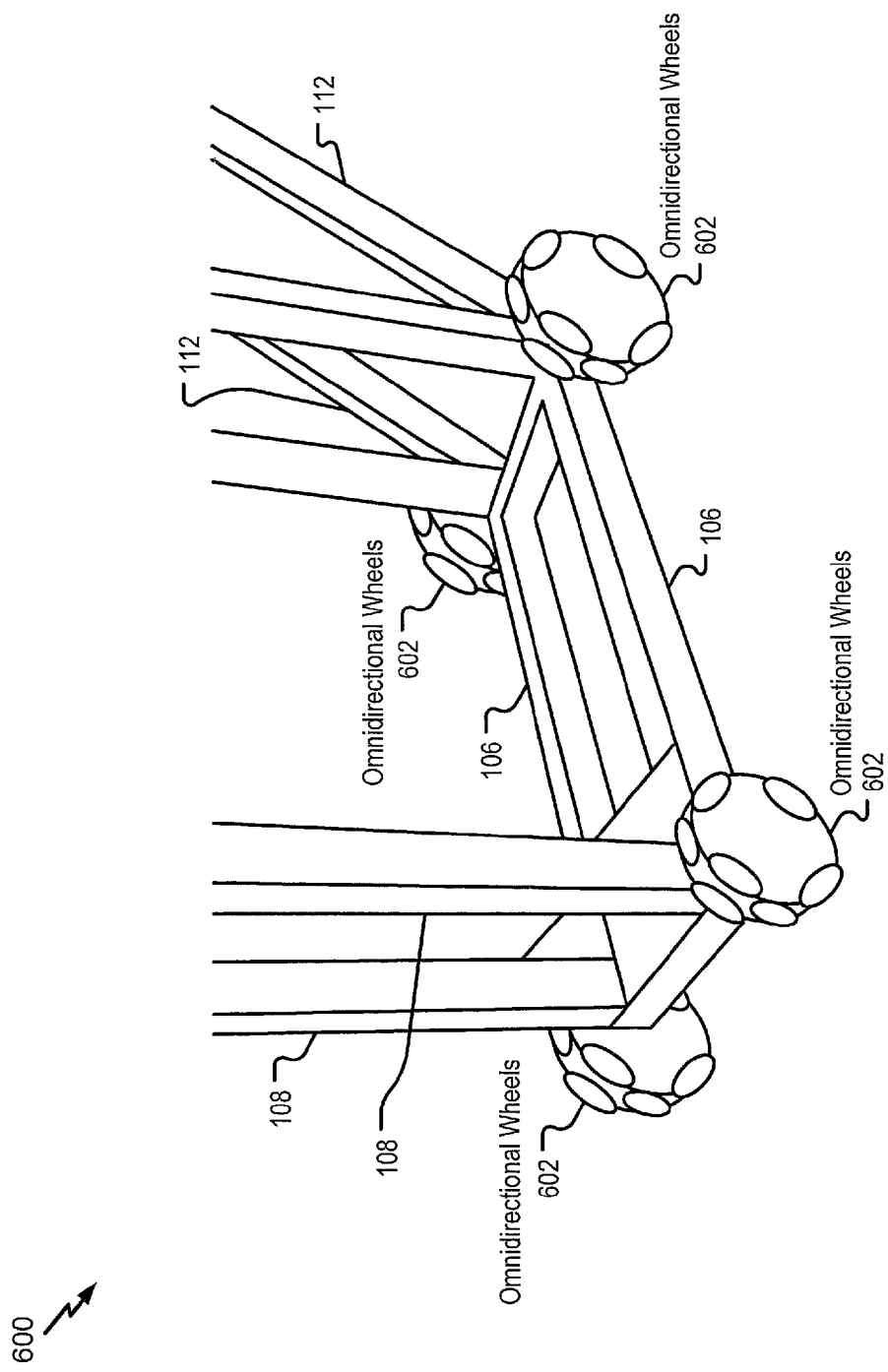
FIG. 6 is a diagram that illustrates a portion of a second example of an instrumentation rack transport device.

Referring to FIG. 6, a portion 600 of a second illustrative example of the instrumentation rack transport device 100 is shown. As illustrated in FIG. 6, a plurality of omnidirectional wheels 602 may be coupled to the second set of members 106. For example, four omnidirectional wheels 602 may be coupled to the four corners of the bottom side (e.g., the second side defined by the second set of members 106). The plurality of omnidirectional wheels 602 may extend external to the frame 102. For example, at least a portion of the plurality of omnidirectional wheels 602 may extend below the bottom side of the frame 102. Because the plurality of omnidirectional wheels 602 are coupled directly to the second set of members 106, the wheel mounts 120 and 122, and the adjustment bar 124, are not included.

The plurality of omnidirectional wheels 602 may be configured to move in a plurality of directions. To illustrate, each of the plurality of omnidirectional wheels 602 may include multiple rotational elements that enable movement in multiple directions. As one example, the plurality of omnidirectional wheels 602 may move "forward" (e.g., in a direction toward the front sides of the frame 102) and "backward" (e.g., in a direction toward the back side of the frame 102), the same as other wheels. Additionally, the plurality of omnidirectional wheels may move in one or more other directions, such as toward either side of the frame 102. In some implementations, the plurality of omnidirectional wheels 602 may move in directions that are perpendicular to or orthogonal to the forward direction and the backward direction.

Although the plurality of omnidirectional wheels 602 are coupled directly to the frame 102 (e.g., to the second set of members 106) in the implementation illustrated in FIG. 6, in other implementations the plurality of omnidirectional wheels 602 may be coupled to the wheel mounts 120 and 122 of FIG. 1. Regardless of how the plurality of omnidirectional wheels 602 are coupled to the instrumentation rack transport device 100, use of the plurality of omnidirectional wheels 602 may enable a greater range of motion for the instrumentation rack transport device 100 than using other types of wheels.

Figure 7:
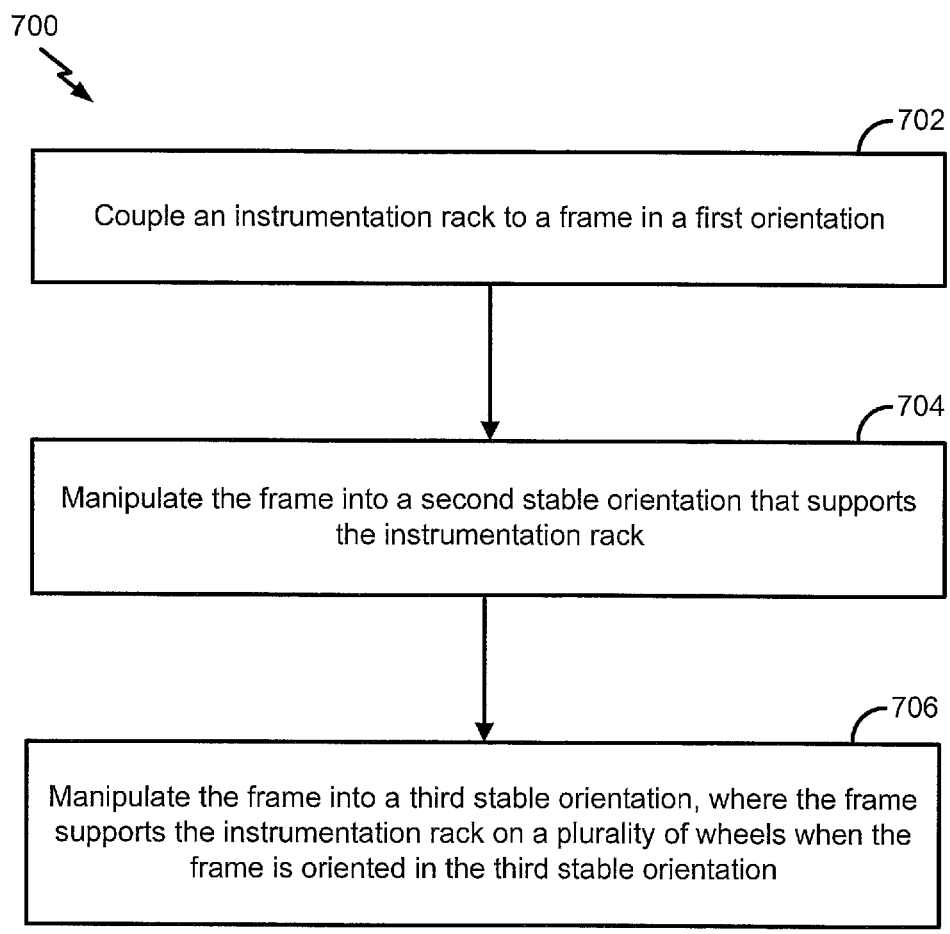
FIG. 7 is a flow chart of a particular example of a method of using an instrumentation rack transport device.

Referring to FIG. 7, a flow chart of a particular illustrative implementation of a method of using an instrumentation rack transport device 100 (shown in FIG. 1) is shown and generally designated 700. The method 700 may be performed by a technician or other operator using the instrumentation rack transport device 100. In a particular implementation, the method 700 is performed using the instrumentation rack transport device 100 of FIG. 1.

The method 700 includes coupling an instrumentation rack to a frame in a first orientation, at 702. The frame may include a first set of members defining a first side configured to be coupled to the instrumentation rack, a second set of members defining a second side, a third set of members defining a third side extending between the first side and the second side, a fourth set of members defining a fourth side, and a fifth set of members defining a fifth side. The fourth side and the fifth side may be joined at an obtuse angle to extend between the first side and the second side. To illustrate, with reference to FIGS. 1 and 3, the instrumentation rack 302 may be coupled to the frame 102 in the first orientation 310. In a particular implementation, the indexing devices 134 in the first support member 130 and the second support member 132 may be coupled to corresponding holes (or other indexing devices) in the instrumentation rack 302. The fourth side (defined by the fourth set of members 110) may be in contact with the ground in the first orientation 310. As described with reference to FIG. 1, the frame 102 may include the first set of members 104 configured to be coupled to the instrumentation rack 302 (e.g., via the first support member 130, the second support member 132, and the indexing devices 134), the second set of members 106, the third set of members 108, the fourth set of members 110, and the fifth set of members 112. The side defined by the fourth set of members 110 and the side defined by the fifth set of members 112 may be joined at the obtuse angle A1 and may extend between the side defined by the first set of members 104 and the side defined by the second set of members 106.

The method 700 includes manipulating the frame into a second stable orientation that supports the instrumentation rack, at 704. For example, with reference to FIG. 3, the frame 102 may be manipulated from the first orientation 310 to the second orientation 312. The frame 102 may support the instrumentation rack 302 on the fifth side (e.g., the side defined by the fifth set of members 112) when the frame 102 is oriented in the second stable orientation 312. In the second orientation 312, the center of gravity 304 of the instrumentation rack 302 may be above the fifth side (e.g., the side defined by the fifth set of members 112).

The method 700 further includes manipulating the frame into a third stable orientation, at 706. For example, with reference to FIG. 3, the frame 102 may be manipulated from the second orientation 312 to the third orientation 314. The frame 102 may support the instrumentation rack 302 on the plurality of wheels 114 when the frame 102 is oriented in the third stable orientation 314, and the plurality of wheels 114 may be coupled to the frame 102 and may extend external from the frame 102.

The method 700 enables operation of an instrumentation rack transport device in one of three stable orientations. Operation of the instrumentation rack transport device in the first orientation enables coupling of the instrumentation rack to the frame. Manipulating the instrumentation rack transport device from the first orientation to the second orientation, and from the second orientation to the third orientation may be easier and have less risk of damage to the instrumentation rack or surroundings than manipulating the instrumentation rack directly from the first orientation to the third orientation. When the instrumentation rack transport device is oriented in the third orientation, the instrumentation rack may be at a sufficient elevation to avoid armrests of aisle seats as the instrumentation rack is transported to a particular location within a furnished, or partially furnished, aircraft.

The illustrations of the examples described herein are intended to provide a general understanding of the structure of the various implementations. The illustrations are not intended to serve as a complete description of all of the elements and features of apparatus and systems that utilize the structures or methods described herein. Many other implementations may be apparent to those of skill in the art upon reviewing the disclosure. Other implementations may be utilized and derived from the disclosure, such that structural and logical substitutions and changes may be made without departing from the scope of the disclosure. For example, method steps may be performed in a different order than shown in the figures or one or more method steps may be omitted. Accordingly, the disclosure and the figures are to be regarded as illustrative rather than restrictive.

Moreover, although specific examples have been illustrated and described herein, it should be appreciated that any subsequent arrangement designed to achieve the same or similar results may be substituted for the specific examples shown. This disclosure is intended to cover any and all subsequent adaptations or variations of various implementations. Combinations of the above implementations, and other implementations not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single example for the purpose of streamlining the disclosure. This disclosure is not to be interpreted as reflecting an intention that the claimed implementations require more features than are expressly recited in each claim. Rather, as the following claims reflect, the claimed subject matter may be directed to less than all of the features of any of the disclosed examples.

Examples described above illustrate but do not limit the disclosure. It should also be understood that numerous modifications and variations are possible in accordance with the principles of the present disclosure. Accordingly, the scope of the disclosure is defined by the following claims and their equivalents.

What is claimed is:

1. A device comprising:
a frame comprising:
a first set of members defining a first side configured to be coupled to an instrumentation rack;
a second set of members defining a second side;
a third set of members defining a third side extending between the first side and the second side;
a fourth set of members defining a fourth side; and
a fifth set of members defining a fifth side, the fourth side and the fifth side joined at an obtuse angle to extend between the first side and the second side; and
a plurality of wheels coupled to the frame and extending external to the frame.

2. The device of claim 1, further comprising one or more wheel mounts coupled to the plurality of wheels and to the frame.

3. The device of claim 2, wherein at least one of the one or more wheel mounts is adjustable.

4. The device of claim 3, wherein the at least one of the one or more wheel mounts is lockable in multiple positions.

5. The device of claim 1, wherein the plurality of wheels comprise a plurality of omnidirectional wheels.

6. The device of claim 1, wherein the frame is configured to be coupled to the instrumentation rack in a first orientation, and wherein the frame is further configured to support the instrumentation rack in at least a second orientation and a third orientation.

7. The device of claim 6, wherein the frame is further configured to support the instrumentation rack on the fifth side when the frame is oriented in the second orientation, and wherein the frame is configured to support the instrumentation rack on the plurality of wheels when the frame is oriented in the third orientation.

8. The device of claim 6, wherein the frame is further configured such that a center of gravity of the instrumentation rack is above the fifth side when the frame is oriented in the second orientation.

9. The device of claim 6, wherein a length of at least one member of the third set of members is configured such that, when the frame is oriented in the third orientation, an elevation of the first side exceeds a height of an aircraft seat armrest.

10. The device of claim 6, wherein an interface between the fourth set of members and the fifth set of members is configured to operate as a fulcrum when the frame is manipulated from the first orientation into the second orientation.

11. The device of claim 6, further comprising an interface between the second set of members and the fifth set of members, wherein the interface includes at least one member that is configured to receive force applied by a user when the frame is manipulated from the first orientation into the second orientation.

12. The device of claim 1, wherein a width of the frame is less than a distance between opposite aircraft seat armrests along an aisle.

13. The device of claim 1, wherein the first set of members includes at least one support member, the at least one support member including one or more indexing devices to facilitate alignment of the frame with the instrumentation rack.

14. The device of claim 1, further comprising a plurality of handles coupled to the third set of members.

15. A method comprising:
coupling an instrumentation rack to a frame in a first orientation, the frame comprising a first set of members defining a first side configured to be coupled to the instrumentation rack, a second set of members defining a second side, a third set of members defining a third side extending between the first side and the second side, a fourth set of members defining a fourth side, and a fifth set of members defining a fifth side, the fourth side and the fifth side joined at an obtuse angle to extend between the first side and the second side; and
manipulating the frame into a second stable orientation that supports the instrumentation rack.

16. The method of claim 15, wherein the frame supports the instrumentation rack on the fifth side when the frame is oriented in the second stable orientation.

17. The method of claim 15, further comprising manipulating the frame into a third stable orientation, wherein the frame supports the instrumentation rack on a plurality of wheels when the frame is oriented in the third stable orientation, and wherein the plurality of wheels are coupled to the frame and extend external from the frame.

18. A system comprising:
an instrumentation rack configured to perform one or more in-flight tests associated with an aircraft; and
a transport device configured to be coupled to the instrumentation rack, the transport device comprising a frame, wherein the frame comprises:
a first set of members defining a first side configured to be coupled to the instrumentation rack;
a second set of members defining a second side;
a third set of members defining a third side extending between the first side and the second side;
a fourth set of members defining a fourth side; and
a fifth set of members defining a fifth side, the fourth side and the fifth side joined at an obtuse angle to extend between the first side and the second side.

19. The system of claim 18, wherein the transport device further comprises one or more adjustable wheel mounts coupled to the second set of members, the one or more adjustable wheel mounts configured to be coupled to a plurality of interchangeable wheels.

20. The system of claim 18, wherein the transport device further comprises a plurality of omnidirectional wheels coupled to the second set of members, the plurality of omnidirectional wheels extending external to the frame.

* * * * *